US007678462B2

(12) United States Patent
Kennedy et al.

(10) Patent No.: US 7,678,462 B2
(45) Date of Patent: *Mar. 16, 2010

(54) SPIN-ON-GLASS ANTI-REFLECTIVE COATINGS FOR PHOTOLITHOGRAPHY

(75) Inventors: Joseph Kennedy, San Jose, CA (US); Teresa Baldwin, Fremont, CA (US); Nigel P. Hacker, Palo Alto, CA (US); Richard Spear, San Jose, CA (US)

(73) Assignee: Honeywell International, Inc., Morristown, NJ (US)

( * ) Notice: Subject to any disclaimer, the term of this patent is extended or adjusted under 35 U.S.C. 154(b) by 1167 days.

This patent is subject to a terminal disclaimer.

(21) Appl. No.: 11/178,544

(22) Filed: Jul. 11, 2005

(65) Prior Publication Data
US 2005/0245717 A1    Nov. 3, 2005

Related U.S. Application Data

(60) Division of application No. 10/300,357, filed on Nov. 19, 2002, now Pat. No. 6,969,753, which is a division of application No. 09/491,166, filed on Jan. 26, 2000, now Pat. No. 6,506,497, which is a continuation-in-part of application No. 09/330,248, filed on Jun. 10, 1999, now Pat. No. 6,268,457, application No. 11/178,544, which is a division of application No. 10/076,846, filed on Feb. 14, 2002, now Pat. No. 6,956,097, which is a continuation of application No. 09/491,166, filed on Jan. 26, 2000, now Pat. No. 6,506,497, which is a continuation-in-part of application No. 09/330,248, filed on Jun. 10, 1999, now Pat. No. 6,268,457.

(51) Int. Cl.
*B32B 9/04* (2006.01)
(52) U.S. Cl. .................................. 428/447
(58) Field of Classification Search ................. 428/447
See application file for complete search history.

(56) References Cited

U.S. PATENT DOCUMENTS

| 3,784,378 | A |   | 1/1974  | Gramas |
| 3,884,702 | A |   | 5/1975  | Koshimo et al. |
| 3,925,077 | A |   | 12/1975 | Lewis et al. |
| 3,929,489 | A |   | 12/1975 | Arcesi et al. |
| 4,018,606 | A |   | 4/1977  | Contois et al. |
| 4,018,607 | A |   | 4/1977  | Contois et al. |
| 4,043,812 | A |   | 8/1977  | Stolka et al. |
| 4,048,146 | A |   | 9/1977  | Wilson |
| 4,052,367 | A |   | 10/1977 | Wilson |
| 4,102,683 | A |   | 7/1978  | Di Piazza |
| 4,191,571 | A |   | 3/1980  | Nonogaki et al. |
| 4,299,938 | A |   | 11/1981 | Green et al. |
| 4,308,371 | A | * | 12/1981 | Tanaka et al. ............ 528/18 |
| 4,348,471 | A |   | 9/1982  | Shelnut et al. |
| 4,349,609 | A |   | 9/1982  | Takeda et al. |
| 4,362,809 | A |   | 12/1982 | Chen et al. |
| 4,363,859 | A |   | 12/1982 | Sasaki et al. |
| 4,369,284 | A |   | 1/1983  | Chen |
| 4,413,052 | A |   | 11/1983 | Green et al. ............ 430/327 |
| 4,430,153 | A |   | 2/1984  | Gleason et al. |
| 4,442,197 | A |   | 4/1984  | Crivello et al. |
| 4,456,679 | A |   | 6/1984  | Leyrer et al. |
| 4,557,996 | A |   | 12/1985 | Aoyama et al. |
| 4,587,138 | A |   | 5/1986  | Yau et al. |
| 4,594,309 | A |   | 6/1986  | Guillet |
| 4,609,614 | A |   | 9/1986  | Pampalone et al. |
| 4,618,213 | A |   | 10/1986 | Chen |
| 4,624,912 | A |   | 11/1986 | Zweifel et al. |
| 4,674,176 | A |   | 6/1987  | Tuckerman |
| 4,678,835 | A |   | 7/1987  | Chang et al. |
| 4,681,795 | A |   | 7/1987  | Tuckerman |
| 4,693,959 | A |   | 9/1987  | Ashcraft |
| 4,705,729 | A |   | 11/1987 | Sheats |
| 4,705,739 | A |   | 11/1987 | Fisch |
| 4,708,925 | A |   | 11/1987 | Newman |
| 4,731,264 | A |   | 3/1988  | Lin et al. |
| 4,732,858 | A |   | 3/1988  | Brewer et al. |
| 4,752,649 | A |   | 6/1988  | Neckers |
| 4,762,767 | A |   | 8/1988  | Haas et al. |
| 4,763,966 | A |   | 8/1988  | Suzuki et al. |
| 4,767,571 | A |   | 8/1988  | Suzuki et al. |
| 4,774,141 | A |   | 9/1988  | Matsui et al. |
| 4,782,009 | A |   | 11/1988 | Bolon et al. |
| 4,783,347 | A |   | 11/1988 | Doin et al. |
| 4,814,578 | A |   | 3/1989  | Tuckerman |
| 4,822,718 | A |   | 4/1989  | Latham et al. |
| 4,831,188 | A |   | 5/1989  | Neckers |
| 4,839,274 | A |   | 6/1989  | Logan |
| 4,855,199 | A |   | 8/1989  | Bolon et al. ............ 430/18 |
| 4,863,827 | A |   | 9/1989  | Jain et al. |

(Continued)

FOREIGN PATENT DOCUMENTS

DE    19852852    5/2000

(Continued)

OTHER PUBLICATIONS

Lin et al. "Linewidth Control Using Anti-Reflective Coating for Optical Lithography", pp. 399-402.

(Continued)

*Primary Examiner*—Margaret G Moore
(74) *Attorney, Agent, or Firm*—Sandra P. Thompson; Buchalter Nemer

(57) ABSTRACT

Anti-reflective coating materials for deep ultraviolet photolithography include one or more organic light-absorbing compounds incorporated into spin-on-glass materials. Suitable absorbing compounds are strongly absorbing over wavelength ranges around wavelengths such as 365 nm, 248 nm, and 193 nm that may be used in photolithography. A method of making absorbing spin-on-glass materials includes combining one or more organic absorbing compounds with alkoxysilane or halosilane reactants during synthesis of the spin-on-glass materials.

5 Claims, 3 Drawing Sheets

U.S. PATENT DOCUMENTS

| | | |
|---|---|---|
| 4,876,165 A | 10/1989 | Brewer et al. |
| 4,910,122 A | 3/1990 | Arnold et al. |
| 4,913,846 A | 4/1990 | Suzuki et al. |
| 4,921,317 A | 5/1990 | Suzuki et al. |
| 4,923,638 A | 5/1990 | Ohno et al. |
| 4,925,772 A | 5/1990 | Quella et al. |
| 4,927,732 A | 5/1990 | Merrem et al. |
| 4,935,320 A | 6/1990 | Rohde et al. |
| 4,935,583 A | 6/1990 | Kyle |
| 4,940,651 A | 7/1990 | Brown et al. |
| 4,942,083 A | 7/1990 | Smith, Jr. |
| 4,950,583 A | 8/1990 | Brewer et al. |
| 4,954,414 A | 9/1990 | Adair et al. |
| 4,970,134 A | 11/1990 | Bronstert et al. |
| 4,973,510 A | 11/1990 | Tanaka |
| 5,004,660 A | 4/1991 | Van Andel et al. |
| 5,009,669 A | 4/1991 | Jollenbeck et al. |
| 5,009,809 A | 4/1991 | Kosin et al. |
| 5,009,810 A | 4/1991 | Wason et al. |
| 5,013,608 A | 5/1991 | Guest et al. |
| 5,024,923 A | 6/1991 | Suzuki et al. |
| 5,026,624 A | 6/1991 | Day et al. |
| 5,037,580 A | 8/1991 | Garcia et al. |
| 5,045,570 A | 9/1991 | Mooney et al. |
| 5,049,414 A | 9/1991 | Kato |
| 5,055,372 A | 10/1991 | Shanklin et al. |
| 5,055,376 A | 10/1991 | Saeva |
| 5,059,500 A | 10/1991 | Needham et al. |
| 5,077,085 A | 12/1991 | Schnur et al. |
| 5,079,600 A | 1/1992 | Schnur et al. |
| 5,100,503 A | 3/1992 | Allman et al. ............... 156/643 |
| 5,102,695 A | 4/1992 | Guest et al. |
| 5,104,692 A | 4/1992 | Belmares |
| 5,106,534 A | 4/1992 | Wason et al. |
| 5,112,728 A | 5/1992 | Tanji et al. |
| 5,116,715 A | 5/1992 | Roland et al. |
| 5,126,289 A | 6/1992 | Ziger |
| 5,137,655 A | 8/1992 | Kosin et al. |
| 5,140,396 A | 8/1992 | Needham et al. |
| 5,152,834 A | 10/1992 | Allman |
| 5,153,254 A | 10/1992 | Chen |
| 5,166,093 A | 11/1992 | Grief |
| 5,173,368 A | 12/1992 | Belmares |
| 5,194,364 A | 3/1993 | Abe et al. |
| 5,199,979 A | 4/1993 | Lin et al. |
| 5,212,046 A | 5/1993 | Lamola et al. |
| 5,212,218 A | 5/1993 | Rinehart |
| 5,219,788 A | 6/1993 | Abernathey et al. |
| 5,239,723 A | 8/1993 | Chen |
| 5,250,224 A | 10/1993 | Wason et al. |
| 5,252,340 A | 10/1993 | Honeycutt |
| 5,252,618 A | 10/1993 | Garcia et al. |
| 5,256,510 A | 10/1993 | Bugner et al. |
| 5,262,468 A | 11/1993 | Chen |
| 5,272,026 A | 12/1993 | Roland et al. |
| 5,272,042 A | 12/1993 | Allen et al. |
| 5,278,010 A | 1/1994 | Day et al. |
| 5,300,402 A | 4/1994 | Card, Jr. et al. |
| 5,302,198 A | 4/1994 | Allman |
| 5,302,455 A | 4/1994 | Wason et al. |
| 5,317,044 A | 5/1994 | Mooney et al. |
| 5,324,222 A | 6/1994 | Chen |
| 5,324,591 A | 6/1994 | Georger, Jr. et al. |
| 5,334,646 A | 8/1994 | Chen |
| 5,336,708 A | 8/1994 | Chen |
| 5,360,692 A | 11/1994 | Kawabe et al. |
| 5,380,621 A | 1/1995 | Dichiara et al. |
| 5,382,615 A | 1/1995 | Godfrey |
| 5,384,357 A | 1/1995 | Levinson et al. |
| 5,389,496 A | 2/1995 | Calvert et al. |
| 5,391,463 A | 2/1995 | Ligler et al. |
| 5,395,734 A | 3/1995 | Vogel et al. |
| 5,401,614 A | 3/1995 | Dichiara et al. |
| 5,403,680 A | 4/1995 | Otagawa et al. |
| 5,417,977 A | 5/1995 | Honeycutt |
| 5,418,136 A | 5/1995 | Miller et al. |
| 5,432,007 A | 7/1995 | Naito |
| 5,439,766 A | 8/1995 | Day et al. |
| 5,439,872 A | 8/1995 | Ito et al. |
| 5,449,639 A | 9/1995 | Wei et al. |
| 5,449,712 A | 9/1995 | Gierke et al. |
| 5,455,145 A | 10/1995 | Tarumoto |
| 5,457,081 A | 10/1995 | Takiguchi et al. |
| 5,458,982 A | 10/1995 | Godfrey |
| 5,467,626 A | 11/1995 | Sanders |
| 5,468,591 A | 11/1995 | Pearce et al. |
| 5,472,488 A | 12/1995 | Allman ................. 106/287.16 |
| 5,475,890 A | 12/1995 | Chen |
| 5,482,817 A | 1/1996 | Dichiara et al. |
| 5,498,345 A | 3/1996 | Jollenbeck et al. |
| 5,498,468 A | 3/1996 | Blaney |
| 5,498,748 A | 3/1996 | Urano et al. |
| 5,500,315 A | 3/1996 | Calvert et al. |
| 5,508,334 A | 4/1996 | Chen |
| 5,510,628 A | 4/1996 | Georger, Jr. et al. |
| 5,512,418 A | 4/1996 | Ma |
| 5,518,818 A | 5/1996 | Kidai et al. |
| 5,527,872 A | 6/1996 | Allman ....................... 528/12 |
| 5,552,260 A | 9/1996 | Vogel et al. |
| 5,554,485 A | 9/1996 | Dichiara et al. |
| 5,576,144 A | 11/1996 | Pearce et al. |
| 5,576,247 A | 11/1996 | Yano et al. |
| 5,576,359 A | 11/1996 | Urano et al. |
| 5,578,318 A | 11/1996 | Honeycutt |
| 5,580,819 A | 12/1996 | Li et al. |
| 5,597,408 A | 1/1997 | Choi |
| 5,624,294 A | 4/1997 | Chen |
| 5,633,286 A | 5/1997 | Chen |
| 5,638,724 A | 6/1997 | Sanders |
| 5,648,201 A | 7/1997 | Dulcey et al. |
| 5,655,947 A | 8/1997 | Chen |
| 5,661,196 A | 8/1997 | Mayer et al. |
| 5,661,992 A | 9/1997 | Sanders |
| 5,663,286 A | 9/1997 | Ahmed et al. ............... 524/474 |
| 5,665,845 A | 9/1997 | Allman |
| 5,670,295 A | 9/1997 | Namba et al. |
| 5,672,243 A | 9/1997 | Hsia et al. |
| 5,674,624 A | 10/1997 | Miyazaki et al. |
| 5,674,648 A | 10/1997 | Brewer et al. |
| 5,677,112 A | 10/1997 | Urano et al. ................. 430/325 |
| 5,679,128 A | 10/1997 | Latting et al. |
| 5,695,551 A | 12/1997 | Buckingham et al. |
| 5,695,910 A | 12/1997 | Urano et al. |
| 5,707,883 A | 1/1998 | Tabara |
| 5,719,249 A | 2/1998 | Fujita et al. |
| 5,741,623 A | 4/1998 | Namba et al. |
| 5,744,243 A | 4/1998 | Li et al. |
| 5,747,223 A | 5/1998 | Allen et al. |
| 5,747,553 A | 5/1998 | Guzauskas |
| 5,750,292 A | 5/1998 | Sato et al. |
| 5,755,867 A | 5/1998 | Chikuni et al. |
| 5,756,257 A | 5/1998 | Landgrebe et al. |
| 5,759,625 A | 6/1998 | Laubacher et al. |
| 5,760,117 A | 6/1998 | Chen |
| 5,773,170 A | 6/1998 | Patel et al. |
| 5,780,206 A | 7/1998 | Urano et al. |
| 5,786,125 A | 7/1998 | Tsuchiya et al. |
| 5,800,926 A | 9/1998 | Nogami et al. |
| 5,843,617 A | 12/1998 | Patel et al. |
| 5,851,730 A | 12/1998 | Thackeray et al. |
| 5,851,738 A | 12/1998 | Thackeray et al. |
| 5,855,960 A | 1/1999 | Ohnishi et al. |
| 5,868,597 A | 2/1999 | Chen |
| 5,873,931 A | 2/1999 | Scholz et al. |

| | | | | | | |
|---|---|---|---|---|---|---|
| 5,883,011 | A | 3/1999 | Lin et al. | 6,284,428 B1 | 9/2001 | Hirosaki et al. |
| 5,884,639 | A | 3/1999 | Chen | 6,287,286 B1 | 9/2001 | Akin et al. |
| 5,910,021 | A | 6/1999 | Tabara | 6,291,143 B1 | 9/2001 | Patel et al. |
| 5,929,159 | A | 7/1999 | Schutt et al. | 6,291,586 B2 | 9/2001 | Lasch et al. |
| 5,935,758 | A | 8/1999 | Patel et al. | 6,296,862 B1 | 10/2001 | Paul et al. |
| 5,938,499 | A | 8/1999 | Chen | 6,306,736 B1 | 10/2001 | Alivisatos et al. |
| 5,939,236 | A | 8/1999 | Pavelchek et al. | 6,315,946 B1 | 11/2001 | Focht |
| 5,939,510 | A | 8/1999 | Sato et al. | 6,316,013 B1 | 11/2001 | Paul et al. |
| 5,945,172 | A | 8/1999 | Yamaya et al. | 6,316,160 B1 | 11/2001 | Shao et al. |
| 5,945,249 | A | 8/1999 | Patel et al. | 6,316,165 B1 | 11/2001 | Pavelchek et al. |
| 5,948,600 | A | 9/1999 | Roschger et al. | 6,323,268 B1 | 11/2001 | Fisher et al. |
| 5,949,518 | A | 9/1999 | Belmares et al. | 6,324,703 B1 | 12/2001 | Chen |
| 5,962,067 | A * | 10/1999 | Bautista et al. .......... 427/163.2 | 6,326,231 B1 | 12/2001 | Subramanian et al. |
| 5,962,572 | A | 10/1999 | Chen | 6,329,117 B1 | 12/2001 | Padmanaban et al. |
| 5,964,917 | A | 10/1999 | Latting | 6,329,118 B1 | 12/2001 | Hussein et al. |
| 5,965,305 | A | 10/1999 | Ligler et al. | 6,333,374 B1 | 12/2001 | Chen |
| 5,972,616 | A | 10/1999 | O'Brien et al. | 6,335,235 B1 | 1/2002 | Bhakta et al. |
| 5,976,666 | A | 11/1999 | Narang et al. | 6,337,089 B1 * | 1/2002 | Yoshioka et al. ............. 424/451 |
| 5,981,675 | A | 11/1999 | Valint, Jr. et al. | 6,342,249 B1 | 1/2002 | Wong et al. |
| 5,985,444 | A | 11/1999 | Olson et al. | 6,344,284 B1 * | 2/2002 | Chou ........................ 428/690 |
| 5,986,344 | A | 11/1999 | Subramanion et al. | 6,344,305 B1 | 2/2002 | Lin et al. |
| 5,994,431 | A | 11/1999 | Olson et al. | 6,348,240 B1 | 2/2002 | Calvert et al. |
| 5,997,621 | A | 12/1999 | Scholz et al. | 6,350,818 B1 | 2/2002 | Hong et al. |
| 5,998,300 | A | 12/1999 | Tabara | 6,352,931 B1 | 3/2002 | Seta et al. |
| 6,008,350 | A | 12/1999 | Roschger et al. | 6,358,294 B1 | 3/2002 | Latting |
| 6,025,077 | A | 2/2000 | Yamaki et al. | 6,365,529 B1 | 4/2002 | Hussein et al. |
| 6,033,283 | A | 3/2000 | Chen | 6,365,765 B1 | 4/2002 | Baldwin et al. ............. 556/440 |
| 6,040,251 | A | 3/2000 | Caldwell | 6,368,400 B1 | 4/2002 | Baldwin et al. |
| 6,043,547 | A | 3/2000 | Hsia et al. | 6,368,681 B1 | 4/2002 | Ogawa ....................... 428/1.23 |
| 6,050,871 | A | 4/2000 | Chen | 6,374,738 B1 | 4/2002 | Lewis et al. |
| 6,051,310 | A | 4/2000 | Cano et al. | 6,387,519 B1 | 5/2002 | Anderson et al. |
| 6,087,068 | A | 7/2000 | Sato et al. | 6,391,524 B2 | 5/2002 | Yates et al. |
| 6,103,456 | A | 8/2000 | Tobben et al. | 6,403,464 B1 | 6/2002 | Chang |
| 6,103,779 | A | 8/2000 | Guzauskas | 6,409,883 B1 | 6/2002 | Makolin et al. |
| 6,107,167 | A | 8/2000 | Bhakta | 6,410,209 B1 | 6/2002 | Adams et al. |
| 6,117,176 | A | 9/2000 | Chen | 6,420,088 B1 | 7/2002 | Angelopoulos et al. |
| 6,137,175 | A | 10/2000 | Tabara | 6,420,475 B1 | 7/2002 | Chen |
| 6,144,083 | A | 11/2000 | Yin | 6,426,125 B1 | 7/2002 | Yang et al. |
| 6,148,830 | A | 11/2000 | Chen | 6,432,191 B2 | 8/2002 | Schutt |
| 6,149,934 | A | 11/2000 | Krzysik et al. | 6,433,037 B1 | 8/2002 | Guzauskas |
| 6,150,250 | A | 11/2000 | Tabara et al. | 6,441,452 B2 | 8/2002 | Yin |
| 6,150,440 | A | 11/2000 | Olson et al. | 6,444,584 B1 | 9/2002 | Hsiao |
| 6,152,906 | A | 11/2000 | Faulks et al. | 6,448,185 B1 | 9/2002 | Andideh et al. |
| 6,161,555 | A | 12/2000 | Chen | 6,448,464 B1 | 9/2002 | Akin et al. |
| 6,165,697 | A | 12/2000 | Thackeray et al. .......... 430/325 | 6,451,503 B1 | 9/2002 | Thackeray et al. |
| 6,171,766 | B1 | 1/2001 | Patel et al. | 6,455,207 B1 | 9/2002 | Katch et al. |
| 6,174,631 | B1 * | 1/2001 | French et al. ................... 430/5 | 6,455,416 B1 | 9/2002 | Subramanian et al. |
| 6,174,977 | B1 | 1/2001 | Ariyoshi et al. | 6,461,970 B1 | 10/2002 | Yin |
| 6,180,025 | B1 | 1/2001 | Schoenfeld et al. | 6,465,358 B1 | 10/2002 | Nashner et al. |
| 6,180,317 | B1 | 1/2001 | Allen et al. | 6,465,889 B1 | 10/2002 | Subramanian et al. |
| 6,187,505 | B1 | 2/2001 | Lin et al. | 6,472,012 B2 | 10/2002 | Nakada et al. |
| 6,187,689 | B1 | 2/2001 | Tabara | 6,472,128 B2 | 10/2002 | Thackeray et al. |
| 6,190,830 | B1 | 2/2001 | Leon et al. | 6,475,892 B1 | 11/2002 | Bhakta |
| 6,190,839 | B1 | 2/2001 | Pavelchek et al. | 6,488,394 B1 | 12/2002 | Mabe et al. |
| 6,190,955 | B1 | 2/2001 | Ilg et al. | 6,491,840 B1 | 12/2002 | Frankenbach et al. |
| 6,191,030 | B1 | 2/2001 | Subramanian et al. | 6,492,441 B2 | 12/2002 | Hong et al. |
| 6,194,121 | B1 | 2/2001 | Namba et al. | 6,497,893 B1 | 12/2002 | Everhart et al. |
| 6,194,534 | B1 | 2/2001 | Baumann et al. | 6,503,233 B1 | 1/2003 | Chen et al. |
| 6,210,862 | B1 | 4/2001 | Day et al. | 6,503,413 B2 | 1/2003 | Uchiyama et al. |
| 6,217,890 | B1 | 4/2001 | Paul et al. | 6,503,525 B1 | 1/2003 | Mayberry et al. |
| 6,225,033 | B1 | 5/2001 | Onishi et al. | 6,503,526 B1 | 1/2003 | Krzysik et al. |
| 6,225,671 | B1 | 5/2001 | Yin ............................. 257/437 | 6,503,586 B1 | 1/2003 | Wu et al. |
| 6,232,424 | B1 | 5/2001 | Zhong et al. | 6,503,692 B2 | 1/2003 | Angelopoulos et al. |
| 6,235,456 | B1 | 5/2001 | Ibok | 6,506,497 B1 | 1/2003 | Kennedy et al. ............. 428/447 |
| 6,238,379 | B1 | 5/2001 | Keuhn, Jr. et al. | 6,514,677 B1 | 2/2003 | Ramsden et al. |
| 6,238,838 | B1 | 5/2001 | Gaschler et al. | 6,528,235 B2 | 3/2003 | Thackeray et al. |
| 6,255,671 | B1 | 7/2001 | Bojarczuk, Jr. et al. | 6,544,717 B2 | 4/2003 | Hirosaki et al. |
| 6,261,676 | B1 | 7/2001 | Olson et al. | 6,552,109 B1 | 4/2003 | Chen |
| 6,261,743 | B1 | 7/2001 | Pavelchek et al. | 6,558,363 B2 | 5/2003 | McDowall et al. |
| 6,268,294 | B1 | 7/2001 | Jang et al. | 6,558,880 B1 | 5/2003 | Goswami et al. |
| 6,268,457 | B1 | 7/2001 | Kennedy et al. ............... 528/39 | 6,562,192 B1 | 5/2003 | Hamilton et al. |
| 6,271,273 | B1 | 8/2001 | You et al. | 6,565,813 B1 | 5/2003 | Garyantes |
| 6,277,750 | B1 | 8/2001 | Pawlowski et al. | 6,566,479 B1 | 5/2003 | Bublewitz et al. |

| | | |
|---|---|---|
| 6,573,175 B1 | 6/2003 | Yin et al. |
| 6,576,382 B2 | 6/2003 | Day et al. |
| 6,576,408 B2 | 6/2003 | Meador et al. |
| 6,576,651 B2 | 6/2003 | Bandyopadhyay et al. |
| 6,582,861 B2 | 6/2003 | Buxbaum et al. |
| 6,592,999 B1 | 7/2003 | Anderson et al. |
| 6,593,388 B2 | 7/2003 | Crivello |
| 6,596,314 B2 | 7/2003 | Wong et al. |
| 6,602,652 B2 | 8/2003 | Adams et al. |
| 6,605,359 B2 | 8/2003 | Robinson et al. |
| 6,605,360 B2 | 8/2003 | Kizaki et al. |
| 6,605,362 B2 | 8/2003 | Baldwin et al. |
| 6,605,542 B2 | 8/2003 | Seta et al. |
| 6,610,457 B2 | 8/2003 | Kim et al. |
| 6,612,828 B2 | 9/2003 | Powers et al. |
| 6,617,257 B2 | 9/2003 | Ni et al. |
| 6,623,791 B2 | 9/2003 | Sadvary et al. |
| 6,627,275 B1 | 9/2003 | Chen |
| 6,632,535 B1 | 10/2003 | Buazza et al. |
| 6,635,281 B2 | 10/2003 | Wong et al. |
| 6,635,341 B1 | 10/2003 | Barancyk et al. |
| 6,645,685 B2 | 11/2003 | Takata et al. |
| 6,649,212 B2 | 11/2003 | Payne et al. |
| 6,649,741 B1 | 11/2003 | O'Brien et al. |
| 6,652,766 B1 | 11/2003 | Frankenbach et al. |
| 6,653,049 B2 | 11/2003 | Pavelchek et al. |
| 6,655,946 B2 | 12/2003 | Foreman et al. |
| 6,667,424 B1 | 12/2003 | Hamilton et al. |
| 6,670,284 B2 | 12/2003 | Yin |
| 6,673,982 B1 | 1/2004 | Chen et al. |
| 6,676,398 B2 | 1/2004 | Foreman et al. |
| 6,676,740 B2 | 1/2004 | Matsumura et al. |
| 6,689,932 B2 | 2/2004 | Kruchoski et al. |
| 6,699,647 B2 | 3/2004 | Lynch et al. |
| 6,702,564 B2 | 3/2004 | Foreman et al. |
| 6,703,169 B2 | 3/2004 | Fuller et al. |
| 6,703,462 B2 | 3/2004 | Lee |
| 6,709,257 B2 | 3/2004 | Foreman et al. |
| 6,712,331 B2 | 3/2004 | Foreman et al. |
| 6,716,566 B2 | 4/2004 | Aoshima |
| 6,717,181 B2 | 4/2004 | Murakami et al. |
| 6,720,125 B2 | 4/2004 | Nakamura |
| 6,726,463 B2 | 4/2004 | Foreman |
| 6,730,454 B2 | 5/2004 | Pfeiffer et al. |
| 6,730,461 B2 | 5/2004 | Hunt et al. |
| 6,737,121 B2 | 5/2004 | Yang et al. |
| 6,749,860 B2 | 6/2004 | Tyrrell et al. |
| 6,752,613 B2 | 6/2004 | Foreman |
| 6,756,103 B2 | 6/2004 | Thompson et al. |
| 6,756,124 B2 | 6/2004 | Kanamori et al. |
| 6,756,520 B1 | 6/2004 | Krzysik et al. |
| 6,758,663 B2 | 7/2004 | Foreman et al. |
| 6,767,689 B2 | 7/2004 | Pavelchek et al. |
| 6,773,861 B2 | 8/2004 | Takashima et al. |
| 6,773,864 B1 | 8/2004 | Thackeray et al. |
| 6,776,094 B1 | 8/2004 | Whitesides et al. |
| 6,777,092 B1 | 8/2004 | Hayashi et al. |
| 6,783,468 B2 | 8/2004 | Sullivan et al. |
| 6,787,281 B2 | 9/2004 | Tao et al. |
| 6,790,024 B2 | 9/2004 | Foreman |
| 6,794,440 B2 | 9/2004 | Chen |
| 6,797,343 B2 | 9/2004 | Lee |
| 6,803,034 B2 | 10/2004 | DuVal et al. |
| 6,803,168 B1 | 10/2004 | Padmanaban et al. |
| 6,808,381 B2 | 10/2004 | Foreman et al. |
| 6,819,049 B1 | 11/2004 | Bohmer et al. |
| 6,824,879 B2 | 11/2004 | Baldwin et al. |
| 6,824,952 B1 | 11/2004 | Minsek et al. |
| 6,825,303 B2 | 11/2004 | Lee |
| 6,832,064 B2 | 12/2004 | Simpson et al. |
| 6,840,752 B2 | 1/2005 | Foreman et al. |
| 6,844,131 B2 | 1/2005 | Oberlander et al. |
| 6,846,614 B2 | 1/2005 | Timpe et al. |
| 6,849,373 B2 | 2/2005 | Pavelchek et al. |
| 6,849,923 B2 | 2/2005 | Seta et al. |
| 6,852,421 B2 | 2/2005 | Wayton et al. |
| 6,852,766 B1 | 2/2005 | DeVoe |
| 6,855,466 B2 | 2/2005 | Pavelchek et al. |
| 6,864,040 B2 | 3/2005 | Muller et al. |
| 6,867,253 B1 | 3/2005 | Chen |
| 6,869,747 B2 | 3/2005 | Sabnis et al. |
| 6,875,005 B2 | 4/2005 | Foreman |
| 6,884,568 B2 | 4/2005 | Timpe et al. |
| 6,887,644 B1 | 5/2005 | Nozaki et al. |
| 6,887,648 B2 | 5/2005 | Pavelchek et al. |
| 6,888,174 B2 | 5/2005 | Hohn et al. |
| 6,890,448 B2 | 5/2005 | Pavelchek |
| 6,890,855 B2 | 5/2005 | Cotte et al. |
| 6,890,865 B2 | 5/2005 | Yin et al. ............. 438/751 |
| 6,893,245 B2 | 5/2005 | Foreman et al. |
| 6,893,797 B2 | 5/2005 | Munnelly et al. |
| 6,896,821 B2 | 5/2005 | Louellet |
| 6,899,988 B2 | 5/2005 | Kidnie et al. |
| 6,900,000 B2 | 5/2005 | Sabnis et al. |
| 6,902,861 B2 | 6/2005 | Tao et al. |
| 6,909,220 B2 | 6/2005 | Chen |
| 6,911,514 B2 | 6/2005 | Bublewitz et al. |
| 6,914,114 B2 | 7/2005 | Baldwin et al. |
| 7,014,982 B2 | 3/2006 | Thackeray et al. |
| 2002/0031729 A1 | 3/2002 | Trefonas, III et al. |
| 2002/0034630 A1 | 3/2002 | Cano et al. |
| 2002/0102417 A1 | 8/2002 | Schutt et al. |
| 2002/0127330 A1 | 9/2002 | Jin et al. |
| 2003/0003176 A1 | 1/2003 | Foreman et al. |
| 2003/0111748 A1 | 6/2003 | Foreman |
| 2003/0125430 A1 | 7/2003 | Adedeji et al. |
| 2003/0157391 A1 | 8/2003 | Coleman et al. |
| 2003/0171729 A1 | 9/2003 | Kaun et al. |
| 2003/0192638 A1 | 10/2003 | Yang et al. |
| 2003/0198578 A1 | 10/2003 | Lee et al. |
| 2003/0224611 A1 | 12/2003 | Seta et al. |
| 2003/0227021 A1 | 12/2003 | Yamazaki et al. |
| 2004/0020689 A1 | 2/2004 | Kagami et al. |
| 2004/0067437 A1 | 4/2004 | Wayton et al. |
| 2004/0072420 A1 | 4/2004 | Enomoto et al. |
| 2004/0072436 A1 | 4/2004 | Ramachandra Rao et al. |
| 2004/0091811 A1 | 5/2004 | Munnelly et al. |
| 2004/0096666 A1 | 5/2004 | Knox et al. |
| 2004/0131979 A1 | 7/2004 | Li et al. |
| 2004/0229158 A1 | 11/2004 | Meador et al. |
| 2004/0247900 A1 | 12/2004 | Ogihara et al. |
| 2004/0253461 A1 | 12/2004 | Ogihara et al. |
| 2004/0253532 A1 | 12/2004 | Wu et al. |
| 2004/0253535 A1 | 12/2004 | Cameron et al. |
| 2005/0019842 A1 | 1/2005 | Prober et al. |
| 2005/0026092 A1 | 2/2005 | Nagase |
| 2005/0042538 A1 | 2/2005 | Babich et al. |
| 2005/0074689 A1 | 4/2005 | Angelopoulos et al. |
| 2005/0074981 A1 | 4/2005 | Meagley et al. |
| 2005/0077639 A1 | 4/2005 | Foreman et al. |
| 2006/0110682 A1 | 5/2006 | Thackeray et al. |
| 2006/0155594 A1 | 7/2006 | Almeida et al. |

FOREIGN PATENT DOCUMENTS

| | | |
|---|---|---|
| EP | 0152377 | 2/1987 |
| EP | 0184248 | 8/1989 |
| EP | 0217137 | 4/1992 |
| EP | 0159428 | 11/1992 |
| EP | 0388503 | 9/1993 |
| EP | 0458651 B1 | 3/1994 |
| EP | 0225676 | 7/1994 |
| EP | 0422570 | 12/1995 |
| GB | 1385241 | 2/1975 |
| GB | 1601288 | 10/1981 |
| JP | 53-138485 | 5/1980 |

| | | | |
|---|---|---|---|
| JP | 60-116132 | | 4/1986 |
| JP | 61-285450 | | 6/1988 |
| JP | 1207310 | | 8/1989 |
| JP | 1245248 | | 9/1989 |
| JP | 63-298334 | | 6/1990 |
| JP | 3064753 | | 3/1991 |
| JP | B-3050459 | | 3/1991 |
| JP | 3152544 | | 6/1991 |
| JP | 3200257 | | 9/1991 |
| JP | 3209476 | | 9/1991 |
| JP | 06-56560 | * | 3/1994 |
| JP | 2003-050459 | | 2/2003 |
| JP | 2006-241407 | A | 9/2006 |
| WO | 02/16477 | A2 | 2/2002 |
| WO | 03/044077 | A1 | 5/2003 |
| WO | 03/044078 | A | 5/2003 |
| WO | 03/044078 | A1 | 5/2003 |
| WO | 03/044600 | A1 | 5/2003 |
| WO | 03/070809 | A2 | 8/2003 |
| WO | 2004/044025 | A2 | 5/2004 |

OTHER PUBLICATIONS

Tanaka et al. "A New Photolighography Technique with Antireflective Coating on Resist: ARCOR", pp. 3900-3904.

Berg et al. "Antireflection coatings on metal layers for photolithographic purposes", p. 1212.

Brewer et al. "The Reduction of the Standing-Wave Effect in Positive Photoresists", pp. 184-186.

Resiser "Photoreactive Polymers—Multilayer Techniques and Plasma Processing", pp. 359-367.

Sheates "Photobleaching Chemistry of Polymers Containing Anthracese", pp. 332-348.

U.S. Appl. No. 90/008,360, Shipley Company, L.L.C.

Crivello et al., J. Polym. Sci.: Polym. Chem. 21 (1983), 97-109.

Degussa, "Silanes for Adhesives and Sealants," 18-19, available at www.dynasylan.com.

Lamola, A. et al., "Chemically Amplified Resists," Solid State Technology, 53-60 (Aug. 1991).

Y.-C. Lin et al., "Some Aspects of Anti-Reflective Coating for Optical Lithography," Advances in Resist Technology and Processing, Proc., SPIE vol. 469, 30-37 (1984).

McKean et al., "Characterization of a Novolac-Based Three-Component Deep-UV Resist," Chem. Mater. (1990) 2, 619-624.

Nalamasu et al., "Development of a Chemically Amplified Positive (CAMP) Resist Material for Single Layer Deep-UV Lithography," Advances in Resist Technology and Processing VII, SPIE 1262, 32-41 (1990).

Silverstein et al., "Spectrometric Identification of Organic Compounds," 4th Ed. John Wiley & Sons 1991, 309-311.

Willson, C.G., "Organic Resist Materials—Theory and Chemistry," Introduction to Microlithography, American Chemical Society, 87-159 (1983).

Hawley's Condensed Chemical Dictionary, 11th ed., 85-86.

"HD Micro Puts Out Positive Polyamide," Electronic News, Jun. 19, 2000.

Jaskot et al., Toxicological Sciences, 22(1): 103-112 (1994).

Yusuke Izumi et al., "Hydrosilyation of Carbonyl Compounds Catalyzed by Solid Acids and Bases," Tetrahedron Letters, vol. 32, No. 36, pp. 4744 (1991).

Berg et al. "Antireflection Coatings on Metal Layers for Photolithographic Purposes", p. 1212.

Crivello et al., J. Poly. Sci.: Polym. Chem. 21 (1983), 97-109.

Y.C. Lin et al., "Some Aspects of Anti-Relflective Coating for Optical Lithography," Advances in Resist Technology and Processing, Proc., SPIE vol. 469, 30-37 (1984).

McKean et al., "Characterization of Novalac-Based Three-Component Deep-UV Resist," Chem. Mater. (1990) 2, 619-624.

Nalamasu et al., "Development of a Chemically Amplified Positive (CAMP) Resist Material for Single Layer Deep-UV Lithography," Advances in Resist Technology and Processing VII, SPIE 1262, 32-41, (1990).

Wilson, C. G. "Organic Resist Materals—Theory and Chemistry," Introduction to Microlithography, American Chemical Society, 87-159 (1983).

Y.C. Lin et al., "Some Aspects of Anti-Reflective Coating for Optical Lithography," Advances in Resist Technology and Processing, Proc., SPIE vol. 459, 30-37 (1984).

Yusuke Izumi et al., "Hydrosilyation of Carbonyl Compounds Catalyzed by Solid Acids and Bases," Tetrahedron Letters, vol. 32, No. 36, pp. 4744 (1991).

* cited by examiner anthraflavic acid
1

9-anthracene carboxylic acid
2

9-anthracene methanol
3 alizarin
4 quinizarin
5 primuline
6

2-hydroxy-4(3-triethoxysily(propoxy)-
diphenylketone
7 rosolic acid
8 triethoxysilylpropyl-1,8-naphthalimide
9

9-anthracene carboxy-methyl triethoxysilane
10 phenyltriethoxysilane
11

4-phenylazophenol
12

SPIN-ON-GLASS ANTI-REFLECTIVE COATINGS FOR PHOTOLITHOGRAPHY

CROSS REFERENCE TO RELATED APPLICATION

This application is a divisional application U.S. application Ser. No. 10/300,357 filed Nov. 19, 2002 of U.S. Pat. No. 6,969,753 issued on Nov. 29, 2005, which is a divisional application of U.S. Ser. No. 09/491,166, filed on Jan. 26, 2000, now U.S. Pat. No. 6,506,497, which is a continuation in part of U.S. Ser. No. 09/330,248, filed on Jun. 10, 1999, now U.S. Pat. No. 6,268,457; and U.S. application Ser. No. 10/076,846 filed on Feb. 14, 2002 U.S. Pat. No. 6,956,097 issued on Oct. 18, 2005, which is a continuation of U.S. Ser. No. 09/491,166 filed on Jan. 26, 2000, now U.S. Pat. No. 6,506,497, which is a continuation in part of U.S. Ser. No. 09/330,248, filed on Jun. 10, 1999, now U.S. Pat. No. 6,268, 457, which are all incorporated herein by reference in their entirety.

TECHNICAL FIELD

The present invention relates generally to spin-on glass materials and more specifically to light-absorbing spin-on glass materials for use as anti-reflective layers in photolithography and methods of producing the materials.

BACKGROUND

To meet the requirements for faster performance, the characteristic dimensions of features of integrated circuit devices have continued to be decreased. Manufacturing of devices with smaller feature sizes introduces new challenges in many of the processes conventionally used in semiconductor fabrication. One of the most important of these fabrication processes is photolithography.

It has long been recognized that linewidth variations in patterns produced by photolithography can result from optical interference from light reflecting off an underlying layer on a semiconductor wafer. Variations in photoresist thickness due to the topography of the underlying layer also induce linewidth variations. Anti-reflective coatings (ARC) applied under a photoresist layer have been used to prevent interference from reflection of the irradiating beam. In addition, anti-reflective coatings partially planarize the wafer topography, helping to improve linewidth variation over steps because the photoresist thickness is more uniform.

Organic polymer films, particularly those that absorb at the i-line (365 nm) and g-line (436 nm) wavelengths conventionally used to expose photoresists, and at the recently used 248 nm wavelength, have been employed as anti-reflective coatings. However, the fact that the organic ARC's share many chemical properties with the organic photoresists can limit usable process sequences. Furthermore organic ARC's may intermix with photoresist layers. One solution to avoid intermixing, is to introduce thermosetting binders as additional components of organic ARC's, as described, for example in U.S. Pat. No. 5,693,691 to Flaim et al. Dyes may also be incorporated in organic ARC's, as well as, optionally, additional additives such as wetting agents, adhesions promoters, preservatives, and plasticizers, as described in U.S. Pat. No. 4,910,122 to Arnold et al.

Silicon oxynitride is another material that has been used as an anti-reflective coating. However, silicon oxynitride works as an ARC by a destructive interference process rather than by absorption, which means that very tight control of the oxynitride thickness is necessary and that the material may not work well as an ARC over highly variable topography. Furthermore silicon oxynitride is typically deposited by chemical vapor deposition, while photoresist layers are typically applied using a spin-coater. The additional chemical vapor deposition process can add to processing complexity.

Yet another class of materials that can be used as an anti-reflective layer is spin-on-glass (SOG) compositions containing a dye. Yau et al., U.S. Pat. No. 4,587,138, disclose a dye such as basic yellow #11 mixed with a spin-on-glass in an amount approximately 1% by weight. Allman et al. U.S. Pat. No. 5,100,503 disclose a cross-linked polyorganosiloxane containing an inorganic dye such as $TiO_2$, $Cr_2O_7$, $MoO_4$, $MnO_4$, or $ScO_4$, and an adhesion promoter. Allman additionally teaches that the spin-on-glass compositions also serve as a planarizing layer. However, the spin-on-glass, dye combinations that have been disclosed to date are not optimal for exposure to the deep ultraviolet, particularly 248 and 193 nm, light sources that are coming into use to produce devices with small feature sizes. Furthermore, not all dyes can be readily incorporated into an arbitrary spin-on-glass composition.

What is needed is an absorbing spin-on-glass anti-reflective coating material that absorbs strongly and uniformly in the deep ultraviolet spectral region. It would be desirable for the ARC layer to be impervious to photoresist developers. It would also be desirable to provide a method to incorporate a range of absorbing compounds into a variety of SOG materials while retaining the desirable properties of the original spin-on-glass materials.

SUMMARY

An anti-reflective coating material for deep ultraviolet photolithography includes one or more organic absorbing compounds incorporated into a spin-on-glass (SOG) material. The spin-on-glass materials include methylsiloxane, methylsilsesquioxane, phenylsiloxane, phenylsilsesquioxane, methylphenylsiloxane, methylphenylsilsesquioxane, and silicate polymers. As used herein, spin-on-glass materials also include hydrogensiloxane polymers of the general formula $(H_{0-1.0}SiO_{1.5-2.0})_x$ and hydrogensilsesquioxane polymers, which have the formula $(HSiO_{1.5})_x$, where x is greater than about 8. Also included are copolymers of hydrogensilsesquioxane and alkoxyhydridosiloxane or hydroxyhydridosiloxane. Spin-on-glass materials additionally include organohydridosiloxane polymers of the general formula $(H_{0-1.0}SiO_{1.5-2.0})_n(R_{0-1.0}SiO_{1.5-2.0})_m$, and organohydridosilsesquioxane polymers of the general formula $(HSiO_{1.5})_n(RSiO_{1.5})_m$, where m is greater than 0 and the sum of n and m is greater than about 8 and R is alkyl or aryl. Coating solutions of spin-on-glass materials incorporating absorbing compounds are used to form anti-reflecting films on various layers in integrated circuit devices.

Absorbing compounds suitable for use with the present invention are strongly absorbing at wavelengths less than about 375 nm or less than about 260 nm. In particular, suitable absorbing compounds are strongly absorbing over at least an approximately 10 nm wide wavelength range around wavelengths such as 248 nm, 193 nm, or other ultraviolet wavelengths, such as 365 nm, that may be used in photolithography. The chromophores of suitable compounds typically have from one to three benzene rings that may or may not be fused. Incorporatable absorbing compounds have an accessible reactive group attached to the chromophore, the reactive groups including hydroxyl groups, amine groups, carboxylic acid groups, and substituted silyl groups with silicon bonded to one, two, or three alkoxy group or halogen atom substituents. The reactive groups may be directly bonded to the chromophore or the reactive groups may be attached to the chromophore through a hydrocarbon bridge.

Examples of suitable organic absorbing compounds include anthraflavic acid, 9-anthracene carboxylic acid, 9-anthracene methanol, alizarin, quinizarin, primuline, 2-hydroxy-4(3-triethoxysilylpropoxy)-diphenylketone, rosolic acid, triethoxysilylpropyl-1,8-naphthalimide, 9-anthracene carboxy-methyl triethoxysilane, phenyltriethoxysilane, azo compounds, such as 4-phenylazophenol, and mixtures thereof.

According to another aspect of the present invention, methods for synthesizing absorbing spin-on-glass compositions are provided. Spin-on-glass materials are conventionally synthesized from silane reactants such as triethoxysilane, tetraethoxysilane, methyltriethoxysilane, dimethyldiethoxysilane, tetramethoxysilane, methyltrimethoxysilane, trimethoxysilane, dimethyldimethoxysilane, phenyltriethoxysilane, phenyltrimethoxysilane, diphenyldiethoxysilane, and diphenyldimethoxysilane. Halosilanes, particularly chlorosilanes, for example, trichlorosilane, methyltrichlorosilane, ethyltrichlorosilane, phenyltrichlorosilane, tetrachlorosilane, dichlorosilane, methyldichlorosilane, dimethyldichlorosilane, chlorotriethoxysilane, chlorotrimethoxysilane, chloromethyltriethoxysilane, chloroethyltriethoxysilane, chlorophenyltriethoxysilane, chloromethyltrimethoxysilane, chloroethyltrimethoxysilane, and chlorophenyltrimethoxysilane are also used as silane reactants.

A method of making an absorbing spin-on-glass composition includes combining one or more alkoxysilanes, or, one or more halosilanes, one or more incorporatable organic absorbing compounds, an acid/water mixture, such as a nitric acid/water mixture, and one or more solvents to form a reaction mixture; and refluxing the reaction mixture to form the absorbing spin-on-glass composition. The spin-on-glass composition so formed is diluted with one or more solvents to provide coating solutions that produce films of various thicknesses. Alternative methods of making an absorbing spin-on-glass composition, including methods using halosilanes and a phase transfer catalyst, are also provided.

According to yet another aspect of the invention, the absorbing compound of the chemical composition 9-anthracene carboxy-methyl triethoxysilane is provided. A method of synthesizing 9-anthracene carboxy-methyl triethoxysilane includes combining 9-anthracene carboxylic acid, chloromethyltriethoxysilane, triethylamine, and a solvent to form a reaction mixture; refluxing the reaction mixture; cooling the refluxed reaction mixture to form a precipitate and a remaining solution; and filtering the remaining solution to produce liquid 9-anthracene carboxy-methyl triethoxysilane.

DETAILED DESCRIPTION

Figure 1A:
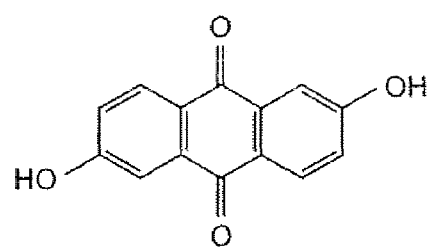
FIGS. 1a and 1b illustrate the chemical formulas of absorbing compounds incorporated into spin-on-glass compositions, according to embodiments of the present invention.
Figure 1A:
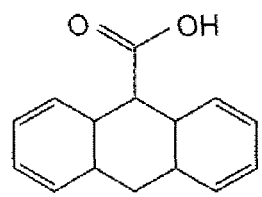
Figure 1A:
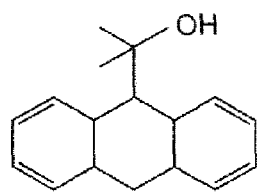
Figure 1A:
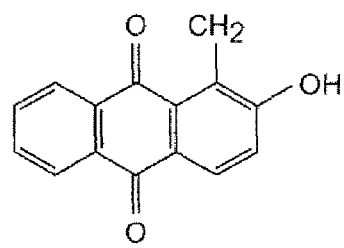
Figure 1A:
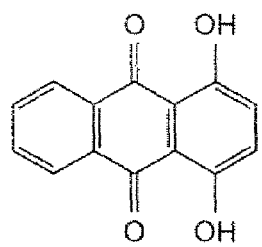
Figure 1A:
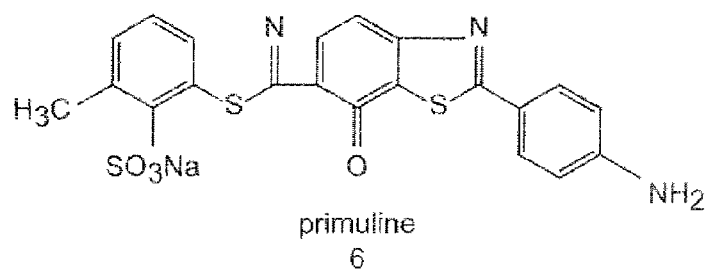

An anti-reflective coating material for deep ultraviolet photolithography includes one or more organic absorbing compounds incorporated into a spin-on-glass (SOG) material. The absorbing spin-on-glass compositions are dissolved in appropriate solvents to form coating solutions and applied to various layers of materials in fabricating semiconductor devices. The absorbing spin-on-glass anti-reflective coatings have been designed to be readily integrated into existing semiconductor fabrication processes. Properties that provide integration include developer resistance, thermal stability during standard photoresist processing, and selective removal with respect to underlying layers.

The spin-on-glass materials used in compositions according to aspects of the present invention, include methylsiloxane, methylsilsesquioxane, phenylsiloxane, phenylsilsesquioxane, methylphenylsiloxane, methylphenylsilsesquioxane, and silicate polymers. As used herein, spin-on-glass materials also include hydrogensiloxane polymers of the general formula $(H_{0-1.0}SiO_{1.5-2.0})_x$ and hydrogensilsesquioxane polymers, which have the formula $(HSiO_{1.5})_x$ where x is greater than about 8. Also included are copolymers of hydrogensilsesquioxane and an alkoxyhydridosiloxane or hydroxyhydridosiloxane. Spin-on-glass materials additionally include organohydridosiloxane polymers of the general formula $(H_{0-1.0}SiO_{1.5-2.0})_n(R_{0-1.0}SiO_{1.5-2.0})_m$, and organohydridosilsesquioxane polymers of the general formula $(HSiO_{1.5})_n(RSiO_{1.5})_m$, where m is greater than 0 and the sum of n and m is greater than about 8 and R is alkyl or aryl. Some useful organohydridosiloxane polymers have the sum of n and m from about 8 to about 5000 where R is a $C_1$-$C_{20}$ alkyl group or a $C_6$-$C_{12}$ aryl group. The organohydridosiloxane and organohydridosilsesquioxane polymers are alternatively denoted spin-on-polymers. Specific examples include methylhydridosiloxanes, ethylhydridosiloxanes, propylhydridosiloxanes, t-butylhydridosiloxanes, phenylhydridosiloxanes, methylhydridosilsesquioxanes, ethylhydridosilsesquioxanes, propylhydridosilsesquioxanes, t-butylhydridosilsequioxanes, phenylhydridosilsesquioxanes, and combinations, thereof.

Many naphthalene- and anthracene-based compounds have significant absorption at 248 nm and below. Benzene-based, equivalently termed here phenyl-based, compounds have significant absorption at wavelengths shorter than 200 nm. While these napthalene-, anthracene-, and phenyl-based compounds are frequently referred to as dyes, the term absorbing compound is used here because the absorptions of these compounds are not limited to wavelengths in the visible region of the spectrum. However, not all such absorbing compounds can be incorporated into spin-on-glasses for use as ARC materials. Absorbing compounds suitable for use with the present invention have an absorption peak over at least an approximately 10 nm wide wavelength range centered around wavelengths such as 248 nm, 193 nm, or other ultraviolet wavelengths, such as 365 nm, that may be used in photolithography. Absorbing compounds which only have narrow absorption peaks, for example, less than 2 nm wide, around these wavelengths are not as desirable.

The chromophores of suitable absorbing compounds typically have one, two, or three benzene rings that may or may not be fused. Incorporatable absorbing compounds have an accessible reactive group attached to the chromophore, the reactive groups including hydroxyl groups, amine groups, carboxylic acid groups, and substituted silyl groups with silicon bonded to one, two, or three "leaving groups," such as alkoxy groups or halogen atoms. Ethoxy or methoxy groups or chlorine atoms are frequently used as leaving groups. Thus, suitable reactive groups include siliconethoxy, silicondiethoxy, silicontriethoxy, siliconmethoxy, silicondimethoxy, silicontrimethoxy, chlorosilyl, dichlorosilyl, and trichlorosilyl groups. The reactive groups may be directly bonded to the chromophore, as, for example, in phenyltriethoxysilane, or the reactive groups may be attached to the chromophore through a hydrocarbon bridge, as, for example, in 9-anthracene carboxy-methyl triethoxysilane. The inclusion of silicontriethoxy groups on chromophores, for example, has been found to be advantageous, especially for promoting stability of the absorbing SOG films. Absorbing compounds containing an azo group, —N═N—, and an accessible reactive group, particularly those containing an azo group linking benzene rings, are also useful, especially when absorption around 365 nm is desired.

In the absorbing spin-on-glass, compositions, the absorbing compounds may be incorporated interstitially in the spin-on-glass matrix. Alternatively, the absorbing compounds are chemically bonded to the spin-on-glass polymer. Without being bound to any theory, the inventors suggest that bonding of incorporatable absorbing compounds to the spin-on-glass polymer backbone via the accessible reactive groups provides beneficial results.

Figure 1B:
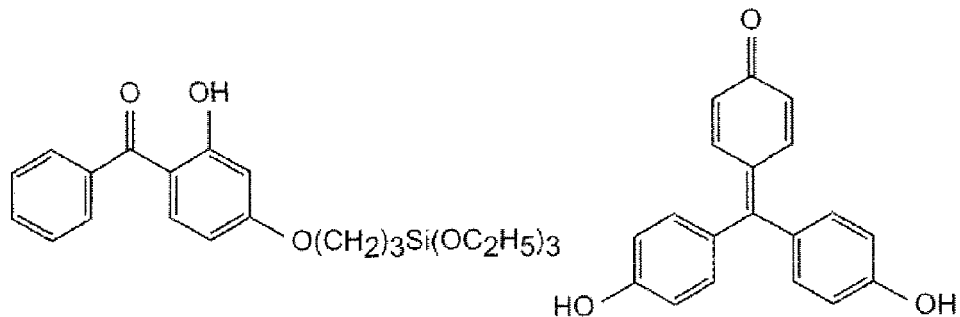
Figure 1B:
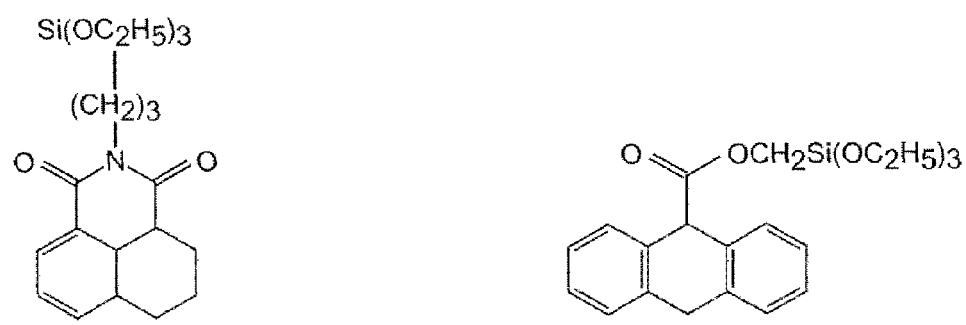
Figure 1B:
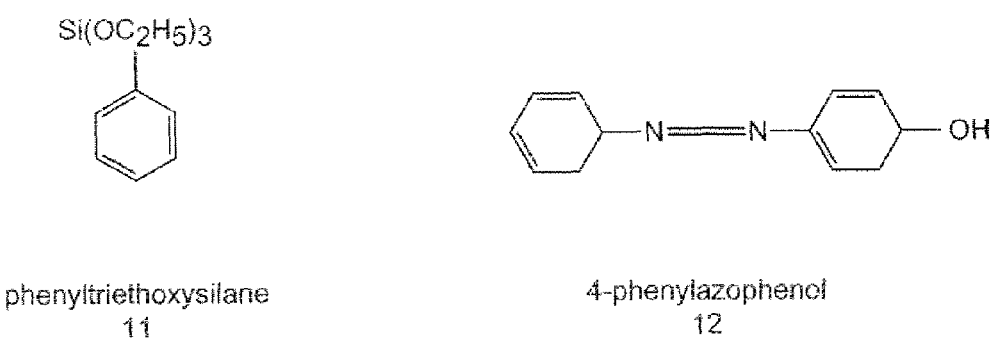

Examples of absorbing compounds suitable for use with the present invention include anthraflavic acid (1), 9-anthracene carboxylic acid (2), 9-anthracene methanol (3), alizarin (4), quinizarin (5), primuline (6), 2-hydroxy-4(3-triethoxysilylpropoxyidiphenylketone (7), rosolic acid (8), triethoxysilylpropyl-1,8-naphthalimide (9), and 9-anthracene carboxy-methyl triethoxysilane (10), phenyltriethoxysilane (11), 4-phenylazophenol, (12), and combinations, thereof. Chemical formulas of absorbing compounds 1-12 are illustrated in FIGS. 1a-1b. Advantageous results have been obtained, for example, with 9-anthracene carboxy-methyl triethoxysilane (10) with combinations of 9-anthracene methanol (3), 2-hydroxy-4(3-triethoxysilylpropoxy)-diphenylketone (7), and rosolic acid (8), and with phenyltriethoxysilane (11).

Absorbing compounds 1-9 and 12 are available commercially, for example, from Aldrich Chemical Company (Milwaukee, Wisc.). Absorbing compound 10 is synthesized using esterification methods, as described immediately below. Absorbing compound 11 is available commercially from Gelest, Inc. (Tullytown, Pa.). Examples of phenyl-based absorbing compounds in addition to absorbing compound (11), many of which are also commercially available from Gelest, Inc., include structures with silicon-based reactive groups attached to phenyl rings or to substituted phenyls, such as methylphenyl, chlorophenyl, and chloromethylphenyl. Specific phenyl-based absorbing compounds include phenyltrimethoxysilane, benzyltrichlorosilane, chloromethylphenyltrimethoxysilane, phenyltrifluorosilane, to name only a few examples. Diphenyl silanes including one or two "leaving groups," such as diphenylmethylethoxysilane, diphenyldiethoxysilane, and diphenyldichlorosilane, to again name only a few examples, are also suitable incorporatable absorbing compounds.

A method of synthesizing 9-anthracene carboxy-methyl triethoxysilane (10) uses 9-anthracene carboxylic acid (2) and chloromethyl triethoxysilane as reactants. The reactants are combined with triethylamine and methylisobutylketone (MIBK), previously dried over 4 Å molecular sieves, to form a reaction mixture which is heated to reflux and refluxed for from approximately 6 to 10 hours. After reflux, the reaction mixture is cooled overnight leading to a large quantity of solid precipitate. The remaining solution is roto-evaporated, filtered through a silica gel column, and roto-evaporated a second time, to produce 9-anthracene carboxy-methyl triethoxysilane (10) as a dark amber oily liquid, which may be purified.

According to another aspect of the present invention, methods for synthesizing absorbing spin-on-glass compositions are provided. Spin-on-glass materials are typically synthesized from a variety of silane reactants including, for example, triethoxysilane (HTEOS), tetraethoxysilane (TEOS), methyltriethoxysilane (MTEOS), dimethyldiethoxysilane, tetramethoxysilane (TMOS), methyltrimethoxysilane (MTMOS), trimethoxysilane, dimethyldimethoxysilane, phenyltriethoxysilane (PTEOS), phenyltrimethoxysilane (PTMOS), diphenyldiethoxysilane, and diphenyldimethoxysilane. Halosilanes, particularly chlorosilanes such as trichlorosilane, methyltrichlorosilane, ethyltrichlorosilane, phenyltrichlorosilane, tetrachlorosilane, dichlorosilane, methyldichlorosilane, dimethyldichlorosilane, chlorotriethoxysilane, chlorotrimethoxysilane, chloromethyltriethoxysilane, chloroethyltriethoxysilane, chlorophenyltriethoxysilane, chloromethyltrimethoxysilane, chloroethyltrimethoxysilane, and chlorophenyltrimethoxysilane are also used as silane reactants. To produce the absorbing spin-on-glass compositions, the absorbing compounds, such as absorbing compounds 1-12, or combinations thereof, are combined with the silane reactants during the synthesis of the SOG materials.

In a first method, a reaction mixture including silane reactants, for example HTEOS, or TEOS and MTEOS, or, TMOS and MTMOS; or, alternatively, tetrachlorosilane and methyltrichlorosilane, one or more absorbing compounds, such as absorbing compounds 1-12; a solvent or combination of solvents; and an acid/water mixture, is formed in a reaction vessel. Appropriate solvents include acetone, 2-propanol, and other simple alcohols, ketones and esters such as 1-propanol, MIBK, propoxypropanol, and propyl acetate. The acid/water mixture is, for example nitric acid and water. Other protic acids or acid anhydrides, such as acetic acid, formic acid, phosphoric acid, hydrochloric acid or acetic anhydride are alternatively used in the acid mixture. The resulting mixture is refluxed for between approximately 1 and 24 hours to produce the absorbing SOG polymer solution.

The absorbing SOG can be diluted with appropriate solvents to achieve coating solutions that produce films of various thicknesses. Suitable dilutant solvents include acetone, 2-propanol, ethanol, butanol, methanol, propylacetate, ethyl lactate, and propylene glycol propyl ether, referred to commercially as Propasol-P. Dilutant solvents with high boiling points such as ethyl lactate and propylene glycol propyl ether have been found beneficial. It is believed high boiling point solvents decrease the probability of formation of bubble film defects. In contrast, lower boiling point solvents may become entrapped below a crosslinked top layer of a film and subsequently produce voids when driven off during a baking process step. Additional solvents useful in the invention include ethylene glycol dimethyl ether, alternatively termed glyme, anisole, dibutyl ether, dipropyl ether, propylene glycol methyl ether acetate, and pentanol. Optionally, surfactants, such as the product FC430, provided by 3M (Minneapolis, Minn.), or the product Megaface R08, provided by DIC (Japan), are also added to the coating solution. The coating solution is typically between about 0.5 and 20% polymer by weight. Prior to use, the coating solution is filtered by standard filtration techniques.

According to a second method of forming absorbing SOG materials, a reaction mixture including silane reactants, one or more of absorbing compounds, such as absorbing compounds 1-12, and a solvent or combination of solvents is formed in a reaction vessel. The reaction mixture is heated to reflux and refluxed for between approximately 1 and 24 hours. The silane reactants and solvents are as described in the first method above. An acid/water mixture, as described above, is added to the reaction mixture while stirring. The resulting mixture is heated to reflux and refluxed for between approximately 1 and 24 hours to produce the absorbing SOG polymer. The absorbing SOG is diluted and filtered as described above to form a coating solution.

A method of forming an absorbing organohydridosiloxane material includes forming a mixture of a dual phase solvent which includes both a non-polar solvent and a polar solvent and a phase transfer catalyst; adding one or more organotrihalosilane, hydridotrihalosilane, and one or more of absorbing compounds, such as absorbing compounds 1-12, to provide a dual phase reaction mixture; and reacting the dual phase reaction mixture for between 1 and 24 hours to produce the absorbing organohydridosiloxane polymer. The phase transfer catalyst includes but is not limited to tetrabutylammonium chloride and benzyltrimethylammonium chloride. Exemplary non-polar solvents include, but are not limited to, pentane, hexane, heptane, cyclohexane, benzene, toluene, xylene, halogenated solvents such as carbon tetrachloride and mixtures thereof. Useful polar solvents include water, alcohols, and alcohol and water mixtures. The absorbing polymer solution is diluted and filtered as described above to form a coating solution.

The absorbing SOG coating solutions are applied to various layers used in semiconductor processing, depending on the specific fabrication process, typically by conventional spin-on deposition techniques. These techniques include a dispense spin, a thickness spin, and thermal bake steps, to produce an absorbing SOG anti-reflective film. Typical processes include a thickness spin of between 1000 and 4000 rpm for about 20 seconds and two or three bake steps at temperatures between 80° C. and 300° C. for about one minute each. The absorbing SOG anti-reflective films, according to the present invention exhibit refractive indices between about 1.3 and about 2.0 and extinction coefficients greater than 0.07. As reported below in Examples 15-17, extinction coefficients greater than 0.4 have been obtained. In contrast, the extinction coefficient of dielectric materials such as silicon dioxide, silicate, and methylsiloxane, are about zero at wavelengths greater than 190 nm.

Figure 2A:
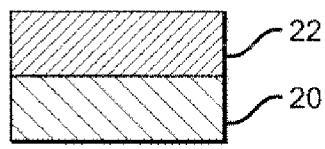
FIGS. 2a-2h illustrate the use of absorbing spin-on-glass compositions, according to embodiments of the present invention as anti-reflective coating layers in a photolithography process.
Figure 2B:
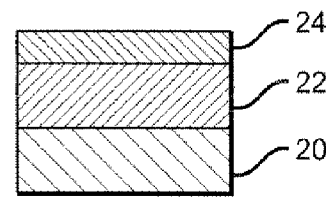
Figure 2C:
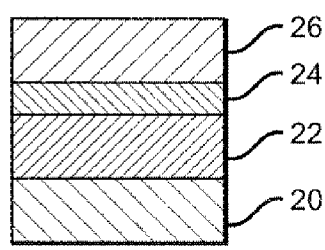
Figure 2D:
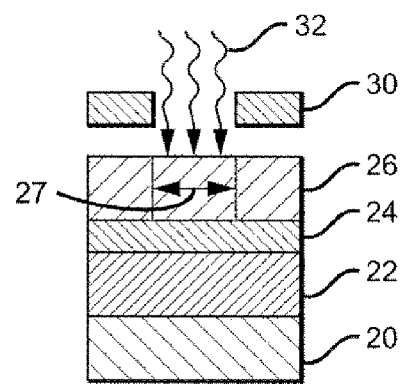

A general method of using an absorbing spin-on-glass material according to the present invention as an anti-reflective layer in a photolithographic process in fabricating an integrated circuit (IC) device is illustrated in FIGS. 2a-2h. As shown in FIG. 2a, a dielectric layer 22 is deposited on a substrate 20. Substrate 20 is a silicon substrate or substrate 20 consists of one or more metal interconnect layers in an IC device. Dielectric layer 22 can be composed of a variety of dielectric materials including, for example, a silicon dioxide layer derived from TEOS, a silane based silicon dioxide layer, a thermally grown oxide, or a chemical-vapor-deposition-produced methylhydridosiloxane or silicon dioxide incorporating other elements or compounds. Dielectric layer 22 is typically an optically transparent medium. An absorbing SOG anti-reflective coating layer 24 is applied above dielectric layer 22 (FIG. 2b) which is covered by a photoresist layer 26, of a conventional positive photoresist, to produce the stack shown in FIG. 2c. The stack of FIG. 2c is exposed to ultraviolet radiation 32 through mask 30, as shown in FIG. 2d. During the exposure, the absorbing SOG ARC layer 24 absorbs UV light 32 transmitted through the photoresist. Because the dielectric layer 22 is transparent in the UV wavelength range, if absorbing SOG ARC layer 24 were not present, the UV light 32 would reflect off the underlying silicon layer 20 degrading a critical dimension, for example critical dimension 27 of the exposed photoresist. In this example, a positive photoresist, which provides direct image transfer, is assumed.

Figure 2E:
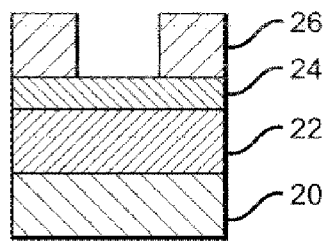

The exposed stack is developed to produce the stack of FIG. 2e. The absorbing SOG ARC layer 24 is resistant to conventional photoresist developer solutions such as a 2.5% solution of tetramethylammoniumhydroxide (TMAH). In contrast, organic ARC layers, which have some of the chemical characteristics of the photoresist materials, are more sensitive to photoresist developers. Furthermore, it is anticipated that absorbing SOG ARC layers are resistant to reducing chemistry, gas-based, photoresist stripping processes, whereas organic ARC's are not resistant. Thus, use of absorbing SOG layers may facilitate photoresist rework, without the need to reapply the ARC layer.

Figure 2F:
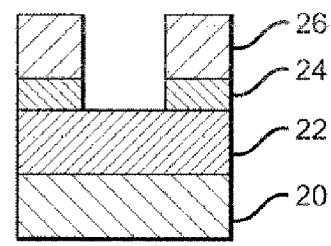

Next, a pattern is etched in the absorbing SOG ARC layer 24 through the opening in photoresist layer 26 to produce the etched stack of FIG. 2f. A fluorocarbon etch, which has a high selectivity to photoresist, is used to etch the absorbing SOG ARC layer 24. The response of the absorbing SOG to a fluorocarbon etch provides an additional advantage of the absorbing SOG over organic ARC layers, which require an oxygen plasma etch. An oxygen plasma etch can degrade the critical dimension of the developed photoresist because the photoresist, being organic based, is also etched by an oxygen plasma. A fluorocarbon plasma consumes less photoresist than an oxygen plasma. At shorter UV wavelengths, depth of focus requirements will limit the thickness of photoresist layer 26 at the exposure step shown in FIG. 2d. For example, it is estimated that at 193 nm, the thickness of photoresist layer should be approximately 300 nm. Thus, as these short wavelengths start to be employed, it will be important to have an ARC layer that can be etched selectively with respect to the photoresist.

Figure 2G:
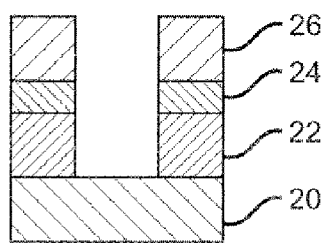
Figure 2H:
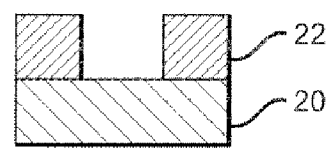

The fluorocarbon etch is continued through the dielectric layer 22 to produce the stack of FIG. 2g. Photoresist layer 26 is partially consumed during the continued etch process. Finally, the photoresist layer 26 is stripped using an oxygen plasma or a hydrogen reducing chemistry and the SOG ARC layer 24 is stripped using either a buffered oxide etch, for example a standard hydrofluoric acid/water mixture, or an aqueous or non-aqueous organoamine. Advantageously, the SOG ARC layer can be stripped with solutions that show a good selectivity with respect to the underlying dielectric layer. Thus, the general photolithographic method shown in FIGS. 2a-2h illustrate the process advantages of absorbing SOG materials as anti-reflective coating layers.

The methods of synthesizing the absorbing SOG materials as well as the synthesis of absorbing compound 10, 9-anthracene carboxy-methyl triethoxysilane, are illustrated in the following examples.

Example 1

Synthesis of Absorbing SOG Containing 9-anthracene carboxy-methyl triethoxysilane In a 1-liter flask 297 grams 2-propanol, 148 grams acetone, 123 grams TEOS, 77 grams MTEOS, 60 grams 9-anthracene carboxy-methyl triethoxysilane, 0.6 grams 0.1 M nitric acid and 72 grams deionized water were combined. The flask was refluxed for 4 hours. To the solution, 115 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180°

C. for one minute each. Optical properties were measured with an N & K Technology Model 1200 analyzer. The film thickness was 1635 Å. At 248 nm, the refractive index (n) was 1.373 and the extinction coefficient (k) was 0.268. The same spin and bake process parameters and measurement technique was used in all of the following examples.

Example 2

Synthesis of Absorbing SOG Containing 9-anthracene methanol, 2-hydroxy-4(3-trieothoxysilypropoxy)-diphenylketone, and rosolic acid In a 1-liter flask 297 grams 2-propanol, 148 grams acetone, 123 grams TEOS, 77 grams MTEOS, 25 grams 9-anthracene methanol, 10 grams 2-hydroxy-4(3-trieothoxysilypropoxy)-diphenylketone, 5 grams rosolic acid, 0.6 grams 0.1 M nitric acid and 72 grams deionized water were combined. The flask was refluxed for 4 hours. To the solution, 111 grams of butanol, 459 grams 2-propanol, 230 grams of acetone, 309 grams of ethanol, 50 grams deionized water and 3.75 grams of 10% FC 430 (3M, Minneapolis, Minn.) were added. Thickness=1436 Å, $n=1.479$, $k=0.1255$ Example 3

Synthesis of Absorbing SOG Containing 9-anthracene methanol, 2-hydroxy-4(3-trieothoxysilypropoxy)-diphenylketone, and rosolic acid In a 1-liter flask 297 grams 2-propanol, 148 grams acetone, 93 grams TEOS, 77 grams MTEOS, 20 grams 9-anthracene methanol, 60 grams 2-hydroxy-4(3-trieothoxysilypropoxy)-diphenylketone, 5 grams rosolic acid, 0.5599 grams 0.1 M nitric acid and 71.90 grams deionized water were combined. The flask was refluxed for 4 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added. Thickness=4248 Å, $n=1.525$, $k=0.228$ Example 4

Synthesis of Absorbing SOG Containing 9-anthracene methanol, 2-hydroxy-4(3-trieothoxysilypropoxy)-diphenylketone, and rosolic acid In a 1-liter flask 297 grams 2-propanol, 148 grams acetone, 108 grams TEOS, 77 grams MTEOS, 10 grams 9-anthracene methanol, 60 grams 2-hydroxy-4(3-trieothoxysilypropoxy)-diphenylketone, 5 grams rosolic acid, 0.5599 grams 0.1 M nitric acid and 72 grams deionized water were combined. The flask was refluxed for 4 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added. Thickness=4275 Å, $n=1.529$, $k=0.124$ Example 5

Synthesis of Absorbing SOG Containing 2-hydroxy-4(3-trieothoxysilypropoxy)-diphenylketone In a 1-liter flask 297 grams 2-propanol, 148 grams acetone, 123 grams TEOS, 51 grams MTEOS, 60 grams 2-hydroxy-4(3-trieothoxysilypropoxy)-diphenylketone, 0.6 grams 0.1 M nitric acid and 72 grams deionized water were combined. The flask was refluxed for 4 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added. Thickness=3592 Å, $n=1.563$, $k=0.067$ Example 6

Synthesis of Absorbing SOG Containing 9-anthracene methanol

In a 1-liter flask 297 grams 2-propanol, 148 grams acetone, 123 grams TEOS, 77 grams MTEOS, 10 grams 9-anthracene methanol, 0.6 grams 0.1 M nitric acid and 72 grams deionized water were combined. The flask was refluxed for 4 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added. Thickness=3401 Å, $n=1.433$, $k=0.106$ Example 7

Synthesis of Absorbing SOG Containing 9-anthracene methanol, 2-hydroxy-4(3-trieothoxysilypropoxy)-diphenylketone, and rosolic acid In a 1-liter flask 297 grams 2-propanol, 148 grams acetone, 123 grams TEOS, 77 grams MTEOS, 20 grams 2-hydroxy-4(3-trieothoxysilypropoxy)-diphenylketone, 25 grams of 9-anthracene methanol, and 5 grams of rosolic Acid, 0.6 grams 0.1 M nitric acid and 72 grams deionized water were combined. The flask was refluxed for 4 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added. Thickness=3503 Å, $n=1.475$, $k=0.193$ Example 8

Synthesis of Absorbing SOG Containing 9-anthracene methanol, 2-hydroxy-4(3-trieothoxysilypropoxy)-diphenylketone, and rosolic acid In a 1-liter flask 297 grams 2-propanol, 148 grams acetone, 123 grams TEOS, 77 grams MTEOS, 5 grams 2-hydroxy-4(3-trieothoxysilypropoxy)-diphenylketone, 25 grams of 9-anthracene methanol, and 5 grams of rosolic Acid, 0.6 grams 0.1 M nitric acid and 72 grams deionized water were combined. The flask was refluxed for 4 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added. Thickness=3119 Å, $n=1.454$, $k=0.175$ Example 9

Synthesis of Absorbing SOG Containing 9-anthracene methanol, 2-hydroxy-4(3-trieothoxysilypropoxy)-diphenylketone, rosolic acid, quinizarin, and alizarin In a 1-liter flask 297 grams 2-propanol, 148 grams acetone, 123 grams TEOS, 77 grams MTEOS, 20 grams 2-hydroxy-4(3-trieothoxysilypropoxy)-diphenylketone, 25 grams of 9-anthracene methanol, and 5 grams of rosolic acid, 2 grams of quinizarin, 2 grams alizarin, 0.6 grams 0.1 M nitric acid and 72 grams deionized water were combined. The flask was refluxed for 4 hours. To the solution, 57 grams of butanol, 88 grams 2-propanol, 44 grams of acetone, 59 grams of ethanol, 9.5 grams deionized water and 3.7 grams of 10% FC 430 (3M, Minneapolis, Minn.) were added. Thickness=3554 Å, n=1.489, k=0.193

Example 10

Synthesis of Absorbing SOG Containing 9-anthracene methanol, 2-hydroxy-4(3-trieothoxysilypropoxy)-diphenylketone, rosolic acid, and alizarin In a 1-liter flask 297 grams 2-propanol, 148 grams acetone, 123 grams TEOS, 51.5 grams MTEOS, 5 grams 2-hydroxy-4(3-trieothoxysilypropoxy)-diphenylketone, 25 grams of 9-anthracene methanol, 5 grams of rosolic acid, and 2 grams alizarin, 0.5599 grams 0.1 M nitric acid and 71.90 grams deionized water were combined. The flask was refluxed for 4 hours. To the solution, 56.68 grams of butanol, 87.99 grams 2-propanol, 44.10 grams of acetone, 59.31 grams of ethanol, 9.55 grams deionized water and 3.75 grams of 10% FC 430 (3M, Minneapolis, Minn.) were added. Thickness=3109 Å, n=1.454, k=0.193.

Example 11

Synthesis of Absorbing SOG Containing 9-anthracene carboxy-methyl triethoxysilane In a 1-liter flask 297 grams 2-propanol, 148 grams acetone, 123 grams TEOS, 77 grams MTEOS, 30 grams 9-anthracene carboxy-methyl triethoxysilane, 0.6 grams 0.1 M nitric acid and 72 grams deionized water were combined. The flask was refluxed for 4 hours. To the solution, 57 grams of butanol, 88 grams 2-propanol, 44 grams of acetone, 59 grams of ethanol, 9.5 grams deionized water and 3.7 grams of 10% FC 430 (3M, Minneapolis, Minn.) were added. Thickness=3010 Å, n=1.377, k=0.163.

Example 12

Synthesis of Absorbing SOG Containing 9-anthracene methanol

In a 1-liter flask 297 grams 2-propanol, 148 grams acetone, 123 grams TEOS, 77 grams MTEOS, and 10 grams 9-anthracene methanol are combined. The solution is refluxed for 6 hours. A mixture of 0.6 grams 0.1 M nitric acid and 72 grams deionized water are added to the flask. The flask is refluxed for 4 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) are added.

Example 13

Synthesis of Absorbing SOG Containing 9-anthracene carboxy-methyl triethoxysilane In a 1-liter flask 297 grams 2-propanol, 148 grams acetone, 90 grams TMOS, 59 grams MTMOS, 60 grams 9-anthracene carboxy-methyl triethoxysilane, 0.6 grams 0.1 M nitric acid and 72 grams deionized water are combined. The flask is refluxed for 4 hours. To the solution, 115 grams of butanol, 488 grams 2-propanol, 245 grams of acetone, 329 grams of ethanol, 53 grams deionized water and 3.8 grams of 10% FC 430 (3M, Minneapolis, Minn.) are added.

Example 14

Synthesis of 9-anthracene carboxy-methyl triethoxysilane

In a 2 L flask, 90.0 g 9-anthracenecarboxylic acid, 86.0 ml chloromethyltriethoxysilane, 66 ml triethylamine, and 1.25 L methylisobutylketone (MIBK) that had been dried over 4 Å molecular sieves were stirred, heated slowly to reflux and refluxed for 8.5 hours. The solution was transferred to a 2 L Teflon bottle and left overnight. A large quantity of solid precipitate formed. The MIBK solution was decanted and roto-evaporated to about 200 g. An equal weight of hexane was added and mixed. A precipitate formed. A 1.75 inch diameter by 2 inch high column of silica gel slurried with 20% ethylacetate/80% hexane was prepared. The MIBK/hexane solution was passed through the column under pressure and the column washed with 800 ml of 20% ethylacetate/80% hexane. The solution was filtered to 0.2 μm and roto-evaporated. When the solvent stopped coming off, the temperature was raised to 35° C. for 60 minutes. A dark amber oily liquid product was obtained (85 g).

Example 15

Synthesis of Absorbing SOG Containing 9-anthracene carboxy-methyl triethoxysilane In a 1-liter flask 297 grams (4.798 moles), 2-Propanol, 148 grams (2.558 moles) acetone, 123 grams (0.593 moles) TEOS, 77 grams (0.432 moles) MTEOS, 45 grams (0.102 moles) 9-anthracene carboxy-methyl triethoxysilane, 0.6 grams 0.1 M nitric acid and 72 grams (3.716 moles) deionized water were combined. The flask was refluxed for 4 hours. To the solution, 43 grams (0.590 moles) of butanol and 1260 grams (8.344 moles) of ethyl lactate were added. Thickness=1156 Å, n=1.502, k=0.446.

Example 16

Synthesis of Absorbing SOG Containing 9-anthracene carboxy-methyl triethoxysilane In a 1-liter flask 297 grams (4.798 moles) 2-propanol, 148 grams (2.558 moles) acetone, 123 grams (0.593 moles) TEOS, 77 grams (0.432 moles) MTEOS, 30 grams (0.102 moles) 9-anthracene carboxy-methyl triethoxysilane, 0.6 grams 0.1 M nitric acid and 72 grams (3.716 moles) deionized water were combined. The flask was refluxed for 4 hours. To the solution, 57 grams (0.769 moles) of Butanol, 88 grams (1.422 moles) 2-propanol, 44 grams (0.758 moles) of acetone, 59 grams (1.227 moles) of ethanol, 9.5 grams (0.528 moles) deionized water and 3.7 grams of 10% FC 430 were added. Thickness=1385 Å, n=1.324, k=0.533.

Example 17

Synthesis of Absorbing SOG Containing 9-anthracene carboxy-methyl triethoxysilane In a 1-liter flask 297 grams (4.798 moles), 2-propanol, 148 grams (2.558 moles) acetone, 123 grams (0.593 moles) TEOS, 77 grams (0.432 moles) MTEOS, 45 grams (0.102 moles) 9-anthracene carboxy-methyl triethoxysilane, 0.6 grams 0.1 M nitric acid and 72 grams (3.716 moles) deionized water were combined. The flask was refluxed for 4 hours. To the solution, 43 grams (0.590 moles) of butanol and 981 grams (8.301 moles) of propasol-p were added. Thickness=1407 Å, n=1.334, k=0.551.

Example 18

Synthesis of Absorbing SOG Containing 9-anthracene carboxy-methyl triethoxysilane A 6 L jacketed reactor equipped with a nitrogen inlet, dry ice condenser and a mechanical stirrer is charged with 5000 mL hexanes 720 mL ethanol, 65 mL water and 120 g of a 10% by weight tetrabutylammonium chloride hydrate solution in water. The mixture is equilibrated for 0.5 hr with stirring at 25° C. A mixture of trichlorosilane (377.4 g, 2.78 Mol), methyltrichlorosilane (277.7 g, 1.86 Mol), and (203.8 g, 0.46 Mol) 9-anthracene carboxy-methyl triethoxysilane is added to the reactor using a peristaltic pump over a period of 70 minutes. Upon completion of the silane and absorbing compound addition, hexane is pumped through the lines for 10 minutes. The reaction is stirred for 2.3 hours, the ethanol/$H_2O$ layer is removed and then the remaining hexane solution filtered through a 3 micron (µm) filter, followed by a 1 µm filter. To the solution, (3957 g, 45.92 Mol) hexane is added.

Example 19

Synthesis of Absorbing SOG Containing 9-anthracene carboxy-methyl triethoxysilane In a 5 L flask, 508.8 grams (3.10 Mol) of triethoxysilane (HTEOS), 135.8 g (0.31 Mol) 9-anthracene carboxy-methyl triethoxysilane, and 508.8 g (8.77 Mol) of acetone are mixed by magnetic stirring and cooled to below 20° C. A mixture of 508.8 g (8.77 Mol) of acetone, 46.69 g (2.59 Mol $H_2O$, 0.0009 Mol $HNO_3$) of 0.02N nitric acid, and 37.03 g (2.06 Mol) of deionized water are added slowly through a dropping funnel to the mixture in the 5 L flask over a 45 minute period, maintaining the temperature below 20° C. The solution is refluxed for 8 hours. To the solution, 4631 g (30.67 Mol) ethyl lactate is added.

Example 20

Synthesis of Absorbing SOG Containing phenyltriethoxysilane

In a 1-liter flask 297 grams (4.798 moles) 2-propanol, 148 grams (2.558 moles) acetone, 123 grams (0.593 moles) TEOS, 104 grams (0.432 moles) phenyltriethoxysilane, 0.6 grams 0.1 M nitric acid and 72 grams (3.716 moles) deionized water were combined. The flask was refluxed for 4 hours. To the solution, 57 grams (0.769 moles) of Butanol, 88 grams (1.422 moles) 2-propanol, 44 grams (0.758 moles) of acetone, 59 grams (1.227 moles) of ethanol, 9.5 grams (0.528 moles) deionized water were added. Thickness=1727 Å, n=1.957, k=0.384.

Example 21

Synthesis of Absorbing SOG Containing phenyltriethoxysilane

In a 1-liter flask 297 grams (4.798 moles) 2-propanol, 148 grams (2.558 moles) acetone, 93 grams (0.448 moles) TEOS, 37 grams (0.209 moles) MTEOS, 100 grams (0.418 moles) phenyltriethoxysilane, 0.6 grams 0.1 M nitric acid and 72 grams (3.716 moles) deionized water were combined. The flask was refluxed for 4 hours. To the solution, 57 grams (0.769 moles) of Butanol, 88 grams (1.422 moles) 2-propanol, 44 grams (0.758 moles) of acetone, 59 grams (1.227 moles) of ethanol, 9.5 grams (0.528 moles) deionized water were added. Thickness=1325 Å, n=1.923, k=0.364.

Example 22

Synthesis of Absorbing SOG Containing phenyltriethoxysilane

In a 1-liter flask 297 grams (4.798 moles) 2-propanol, 148 grams (2.558 moles) acetone, 119 grams (0.573 moles) TEOS, 27 grams (0.153 moles) MTEOS 74 grams (0.306 moles) phenyltriethoxysilane, 0.6 grams 0.1 M nitric acid and 72 grams (3.716 moles) deionized water were combined. The flask was refluxed for 4 hours. To the solution, 57 grams (0.769 moles) of Butanol, 88 grams (1.422 moles) 2-propanol, 44 grams (0.758 moles) of acetone, 59 grams (1.227 moles) of ethanol, 9.5 grams (0.528 moles) deionized water were added. Thickness=1286 Å, n=1.889, k=0.286.

Example 23

Synthesis of Absorbing SOG Containing phenyltriethoxysilane

In a 1-liter flask 297 grams (4.798 moles) 2-propanol, 148 grams (2.558 moles) acetone, 73 grams (0.351 moles) TEOS, 45 grams (0.251 moles) MTEOS 121 grams (0.503 moles) phenyltriethoxysilane, 0.6 grams 0.1 M nitric acid and 72 rams (3.716 moles) deionized water were combined. The flask was refluxed for 4 hours. To the solution, 57 grams (0.769 moles) of Butanol, 88 grams (1.422 moles) 2-propanol, 44 grams (0.758 moles) of acetone, 59 grams (1.227 moles) of ethanol, 9.5 grams (0.528 moles) deionized water were added. Thickness=1047 Å, n=1.993, k=0.378.

Example 24

Synthesis of Absorbing SOG Containing phenyltriethoxysilane and 2-hydroxy-4(3-trieothoxysilypropoxy)diphenylketone In a 1-liter flask 297 grams (4.798 moles) 2-propanol, 148 grams (2.558 moles) acetone, 73 grams (0.351 moles) TEOS, 45 grams (0.251 moles) MTEOS, 103 grams (0.428 moles) phenyltriethoxysilane, 12 grams (0.0298 moles) 2-hydroxy-4(3-trieothoxysilypropoxy)-diphenylketone, 0.6 grams 0.1 M nitric acid and 72 grams (3.716 moles) deionized water were combined. The flask was refluxed for 4 hours. To the solution, 57 grams (0.769 moles) of butanol, 88 grams (1.422 moles) 2-propanol, 44 grams (0.758 moles) of acetone, 59 grams (1.227 moles) of ethanol, 9.5 grams (0.528 moles) deionized water were added. Thickness=1514 Å, n=1.969, k=0.325.

Although the invention has been described with reference to particular examples, the description is only an example of the invention's application and should not be taken as a limitation. Various adaptations and combinations of features of the examples disclosed are within the scope of the invention as defined by the following claims.

We claim:

1. A layered material comprising a dyed spin-on glass composition, wherein the composition comprises a silicon-containing moiety and an incorporatable organic absorbing compound that absorbs light over at least an approximately 10 nm wide wavelength range, the range at wavelengths less than about 375 nm, wherein the organic absorbing compound comprises at least one benzene ring and a reactive group comprising a hydroxyl group, an amine group, a carboxylic acid group or a silicon-triethoxy group, wherein the organic absorbing compound comprises a compound including anthraflavic acid, 9-anthracene carboxylic acid, 9-anthracene methanol, alizarin, quinzarin, triethoxysilylpropyl-1,8-naphthalimide, 9-anthracene carboxy-methyl triethoxysilane and mixtures thereof.

2. The layered material of claim 1, wherein the organic absorbing compound comprises 9-anthracene carboxy-methyl triethoxysilane.

3. The layered material of claim 1, wherein the silicon-containing moiety comprises a siloxane polymer.

4. The layered material of claim 3, wherein the siloxane polymer is a polymer comprising methylsiloxane, methylsilsesquioxane, methylphenylsiloxane, methylphenylsilsesquioxane, and silicate polymers.

5. The layered material of claim 1, wherein at least part of the spin-on glass composition can be selectively removed.

* * * * *